(12) United States Patent
Saito

(10) Patent No.: US 10,714,443 B2
(45) Date of Patent: *Jul. 14, 2020

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Hirokazu Saito, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/030,088

(22) Filed: Jul. 9, 2018

(65) Prior Publication Data

US 2018/0315726 A1 Nov. 1, 2018

Related U.S. Application Data

(63) Continuation of application No. 15/786,853, filed on Oct. 18, 2017, now Pat. No. 10,043,773, which is a (Continued)

(30) Foreign Application Priority Data

Sep. 28, 2015 (JP) .................................. 2015-190200

(51) Int. Cl.
*H01L 23/48* (2006.01)
*H01L 23/00* (2006.01)
(Continued)

(52) U.S. Cl.
CPC .......... *H01L 24/14* (2013.01); *H01L 21/6836* (2013.01); *H01L 24/11* (2013.01);
(Continued)

(58) Field of Classification Search
CPC ............... H01L 21/6836; H01L 23/585; H01L 23/3114; H01L 24/14; H01L 24/11
See application file for complete search history.

(56) References Cited

U.S. PATENT DOCUMENTS 6,500,764 B1 12/2002 Pritchett
9,070,754 B2 6/2015 Yutani et al.
(Continued)

FOREIGN PATENT DOCUMENTS

| JP | 2006294855 A | 10/2006 |
|---|---|---|
| JP | 2013168453 A | 8/2013 |
| JP | 2004-288725 | 10/2014 |

OTHER PUBLICATIONS

Japanese Office Action dated Apr. 9, 2019, Application No. 2015-190200, 5 pgs.

*Primary Examiner* — Samuel A Gebremariam
(74) *Attorney, Agent, or Firm* — Volentine, Whitt & Francos, PLLC

(57) ABSTRACT

A semiconductor device including: a substrate including, in a central portion the substrate, n first element formation regions having a rectangular shape and arrayed along a first direction, and n+m second element formation regions arrayed along the first direction adjacent to the first element formation regions; plural projecting electrodes formed at each of the first and the second element formation regions; and plural dummy projecting electrodes formed, at a peripheral portion, overlapping a triangle defined by a first edge of the first element formation region that forms a boundary between the first element formation region and the peripheral portion, and a second edge of the second element formation region that is adjacent to a corner of the first edge and that forms a boundary between the second element formation region and the peripheral portion.

2 Claims, 18 Drawing Sheets

Related U.S. Application Data continuation of application No. 15/273,151, filed on Sep. 22, 2016, now Pat. No. 9,812,417.

(51) Int. Cl.
*H01L 21/683* (2006.01)
*H01L 23/58* (2006.01)

(52) U.S. Cl.
CPC ............ H01L 24/94 (2013.01); *H01L 23/585* (2013.01); *H01L 24/02* (2013.01); *H01L 24/03* (2013.01); *H01L 24/05* (2013.01); *H01L 24/13* (2013.01); *H01L 2221/6834* (2013.01); *H01L 2221/68327* (2013.01); *H01L 2221/68381* (2013.01); *H01L 2224/0239* (2013.01); *H01L 2224/02311* (2013.01); *H01L 2224/02313* (2013.01); *H01L 2224/02331* (2013.01); *H01L 2224/0347* (2013.01); *H01L 2224/0391* (2013.01); *H01L 2224/03462* (2013.01); *H01L 2224/05083* (2013.01); *H01L 2224/05147* (2013.01); *H01L 2224/05166* (2013.01); *H01L 2224/05569* (2013.01); *H01L 2224/05647* (2013.01); *H01L 2224/11002* (2013.01); *H01L 2224/11009* (2013.01); *H01L 2224/1184* (2013.01); *H01L 2224/131* (2013.01); *H01L 2224/13147* (2013.01); *H01L 2224/1401* (2013.01); *H01L 2224/1412* (2013.01); *H01L 2224/94* (2013.01)

(56) References Cited

U.S. PATENT DOCUMENTS

2009/0243087 A1* 10/2009 Nakamura ............ H01L 23/585
  257/723
2013/0207259 A1* 8/2013 Yutani ............... H01L 21/76885
  257/737

* cited by examiner

SEMICONDUCTOR DEVICE AND SEMICONDUCTOR DEVICE MANUFACTURING METHOD

CROSS-REFERENCE TO RELATED APPLICATION

This application is a continuation application of application Ser. No. 15/786,853, filed on Oct. 18, 2017, now U.S. Pat. No. 10,043,773 issued on Aug. 7, 2018, which is a continuation application of application Ser. No. 15/273,151, filed on Sep. 22, 2016, now U.S. Pat. No. 9,812,417 issued on Nov. 7, 2017, which claims priority under 35 USC 119 from Japanese Patent Application No. 2015-190200 filed on Sep. 28, 2015, the disclosure of which is incorporated by reference herein.

BACKGROUND

Technical Field

The present disclosure relates to a semiconductor device and a semiconductor device manufacturing method.

Related Art

Japanese Patent Application Laid-Open (JP-A) No. 2004-288725 discloses a manufacturing method for a semiconductor device in a Wafer Level Chip Size Package (WL-CSP). In this semiconductor device manufacturing method, first, an IC wafer is formed with bump electrodes arrayed on an active face (front face), and a support member is applied to a peripheral edge portion of the active face of the IC wafer. Moreover, a protective tape used during back grinding is applied over the support member, so as to cover the bump electrodes. In a state in which the active face is protected by the protective tape, a non-active face (back face) of the IC wafer is ground by back grinding to make the thickness of the IC wafer thinner. When the back grinding has been completed, the protective tape and the support member are peeled away.

In such a semiconductor device manufacturing method, the non-active face of the IC wafer is ground in a state in which the peripheral edge portion is mechanically supported by the support member, such that cracking and chipping are not liable to occur at the peripheral edge portion of the IC wafer.

In the semiconductor device manufacturing method described above, the support member is applied to the peripheral edge portion of the IC wafer after forming the bump electrodes on the active face of the IC wafer. When the support member is being applied, there is a possibility that the support member could contact the bump electrodes and damage the bump electrodes. Moreover, in the semiconductor device manufacturing method described above, a process to apply the support member is required in addition to a process to apply the protective tape, thereby increasing the number of manufacturing processes.

SUMMARY

The present disclosure provides a semiconductor device that may prevent cracking and chipping at a peripheral portion of a substrate, and that may prevent damage to projecting electrodes.

Moreover, the present disclosure provides a semiconductor device manufacturing method that may reduce the number of manufacturing processes, prevent damage such as cracking and chipping of a substrate when a back face of the substrate is ground, and may achieve a thinner substrate.

A first aspect of the present disclosure is a semiconductor device including: a substrate including, in a central portion of a main face of the substrate, n first element formation regions having a rectangular flat plane shape and are arrayed along a first direction, and n+m second element formation regions having the same shape as the first element formation regions and are arrayed along the first direction and adjacent to the first element formation regions in a second direction intersecting the first direction; plural projecting electrodes formed at each of the first element formation regions and at each of the second element formation regions; and plural dummy projecting electrodes formed, at a peripheral portion of the main face, overlapping a triangle defined by a first edge of the first element formation region that forms a boundary between the first element formation region and the peripheral portion, and a second edge of the second element formation region, the second edge being adjacent to a corner of the first edge and that forms a boundary between the second element formation region and the peripheral portion.

A second aspect of the present disclosure is a semiconductor device manufacturing method including: preparing a substrate including, in a central portion of a main face of the substrate, n first element formation regions having a rectangular flat plane shape and are arrayed along a first direction, and n+m second element formation regions having the same shape as the first element formation regions and are arrayed along the first direction and adjacent to the first element formation regions in a second direction intersecting the first direction; forming plural projecting electrodes at each of the first element formation regions and at each of the second element formation regions, and forming, at a peripheral portion of the main face, plural dummy projecting electrodes so as to overlap a triangle, the triangle defined by a first edge of the first element formation region that forms a boundary between the first element formation region and the peripheral portion, and a second edge of the second element formation region, the second edge being adjacent to a corner of the first edge and that forms a boundary between the second element formation region and the peripheral portion; adhering a protective tape across the entire main face of the substrate so as to cover the projecting electrodes and the dummy projecting electrodes; and, grinding, in a state in which the protective tape are adhered, a back face of the substrate opposite the main face so as to thinner a thickness of the substrate.

According to the above first aspect, the present disclosure may provide a semiconductor device that may prevent cracking and chipping at a peripheral portion of a substrate, and that may prevent damage to projecting electrodes.

According to the above second aspect, the present disclosure may provide a semiconductor device manufacturing method that may reduce the number of manufacturing processes, prevent damage such as cracking and chipping of a substrate when a back face of the substrate is ground, and may achieve a thinner substrate.

BRIEF DESCRIPTION OF THE DRAWINGS

Exemplary embodiments of the present disclosure will be described in detail based on the following figures, wherein.

DETAILED DESCRIPTION

Figure 1:
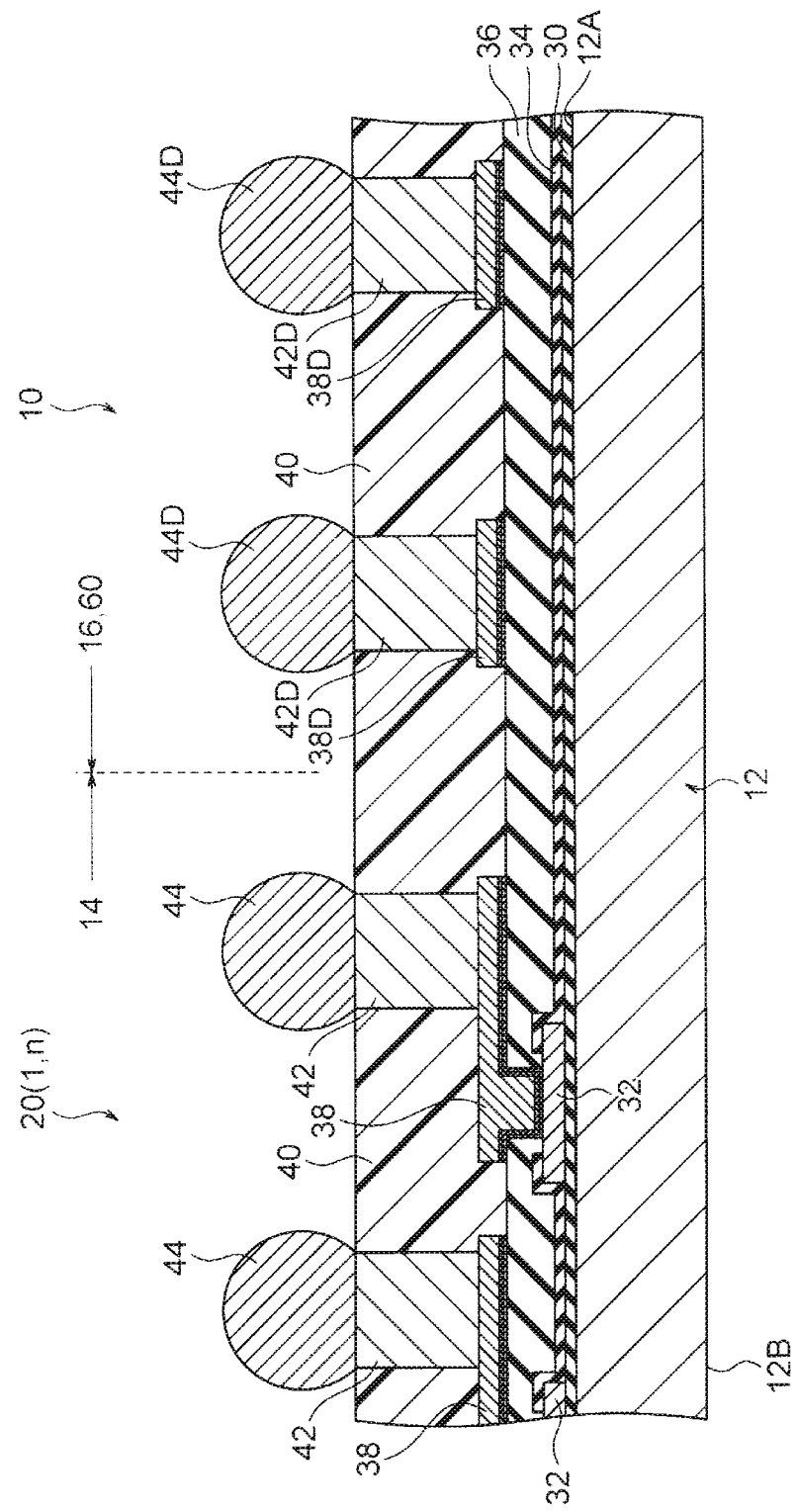
FIG. 1 is a cross-sectional view (a cross-sectional view taken along line A-A in FIG. 3) of relevant portions of a semiconductor device according to a first exemplary embodiment of the present disclosure.

Explanation follows regarding a semiconductor device and a semiconductor device manufacturing method according to exemplary embodiments of the present disclosure, with reference to the drawings. In each of the exemplary embodiments, functional elements having substantially equivalent functions are allocated the same reference numerals, and duplicate explanation thereof is omitted.

First Exemplary Embodiment

Explanation follows regarding a semiconductor device and a semiconductor device manufacturing method according to a first exemplary embodiment of the present disclosure, with reference to FIG. 1 to FIG. 18. Here, an example is described in which the semiconductor device and the semiconductor device manufacturing method according to the first exemplary embodiment are applied to a semiconductor device and a manufacturing method thereof with a wafer level chip size package structure.

Figure 2:
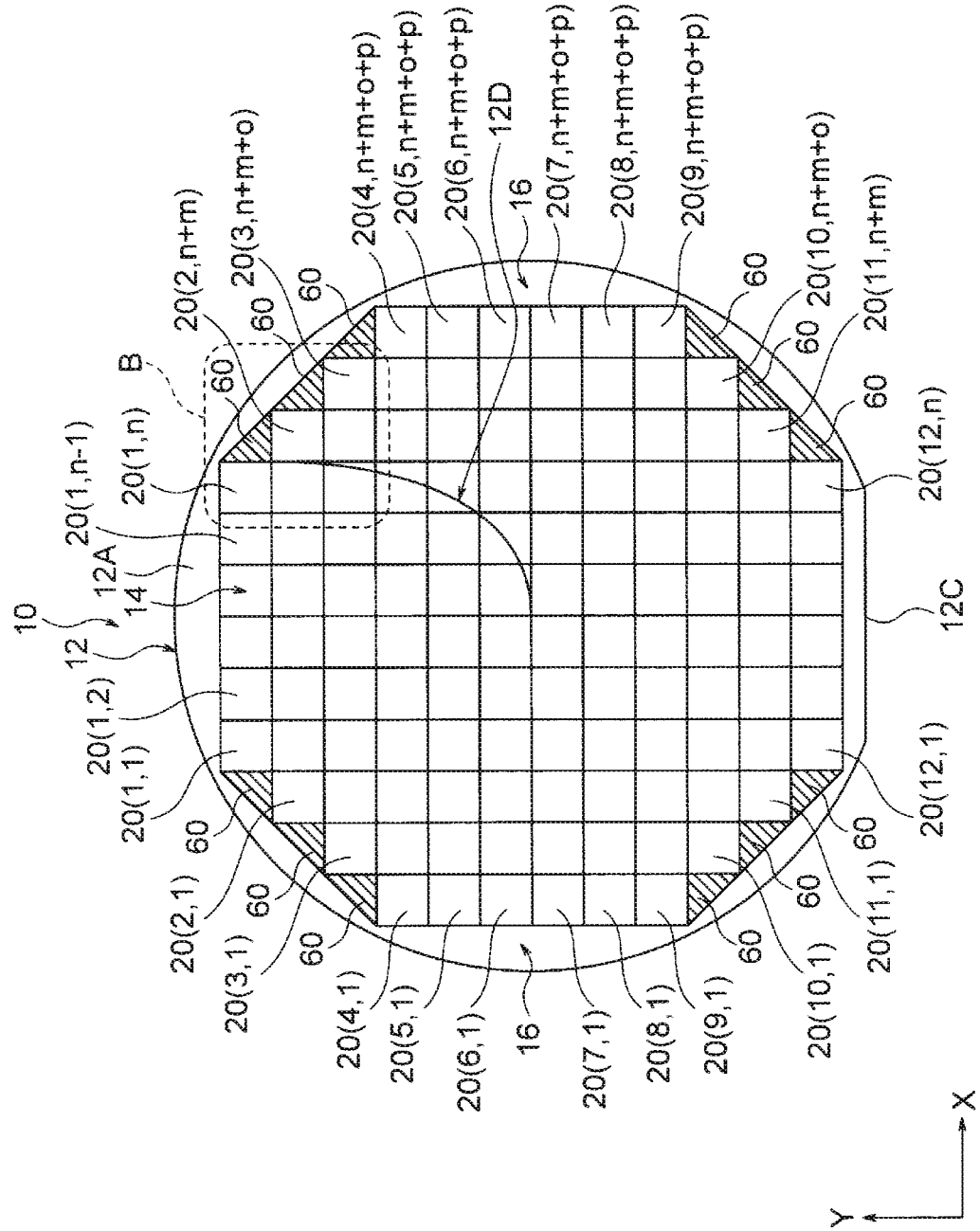
FIG. 2 is a plan view illustrating the entire semiconductor device illustrated in FIG. 1.
Figure 3:
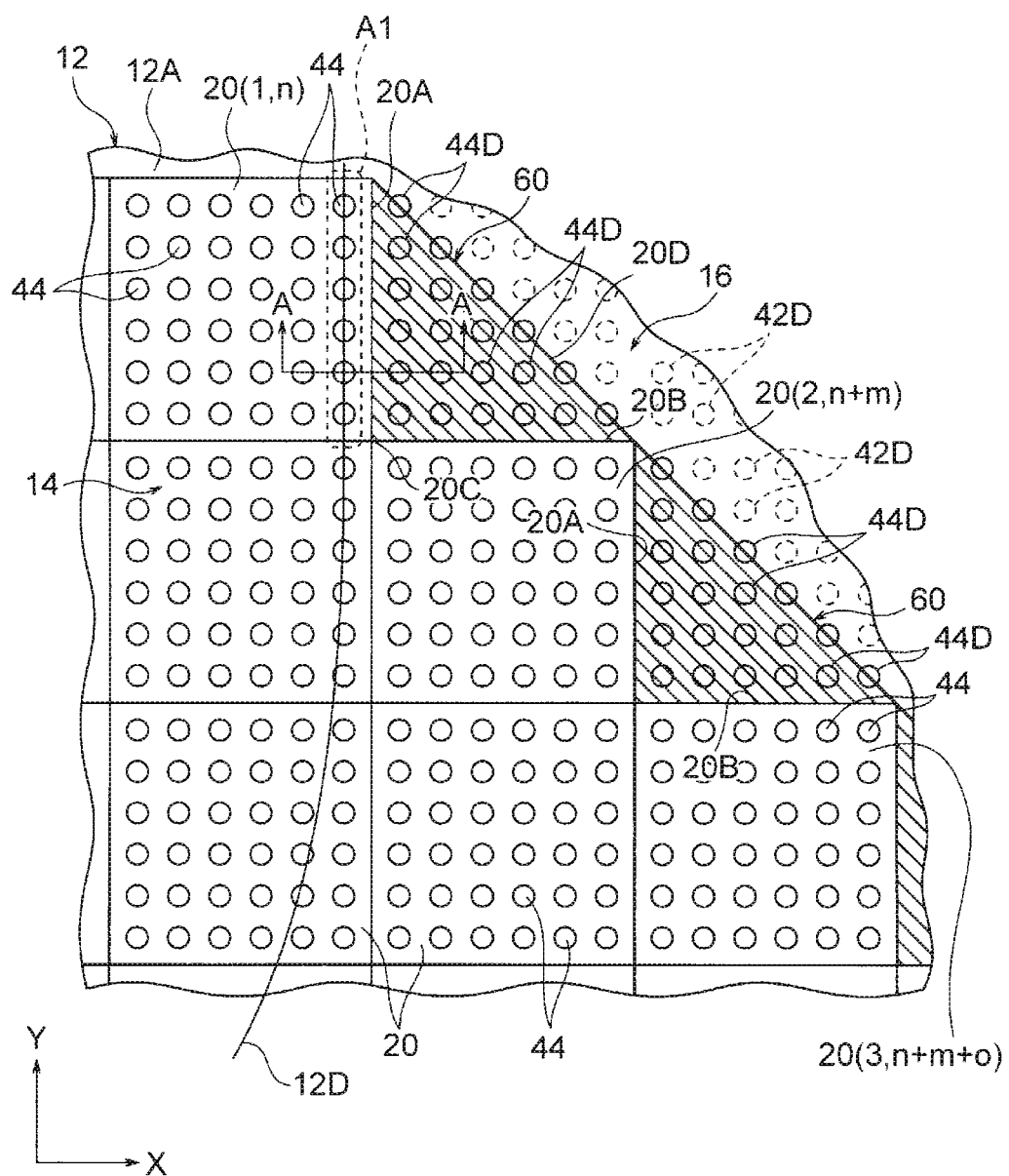
FIG. 3 is an enlarged plan view (an enlarged plan view of the region B surrounded by dashed lines in FIG. 2) illustrating relevant portions of the semiconductor device illustrated in FIG. 2.

As illustrated in FIG. 1 to FIG. 3, a semiconductor device 10 according to the present exemplary embodiment includes a semiconductor wafer 12, serving as a substrate. In the present exemplary embodiment, a silicon single crystal wafer is employed as the semiconductor wafer 12. As illustrated in FIG. 2, in plan view, the semiconductor wafer 12 is formed in a circular shape. A portion of the circumference of the semiconductor wafer 12 (at the bottom side in FIG. 2) is formed with an orientation flat 12C that is employed for positioning during manufacture and transportation. The semiconductor wafer 12 is, for example, set with a thickness of from 600 μm to 650 μm prior to back grinding, described later. The semiconductor wafer 12 is thinned to a thickness of 200 μm or lower, and preferably 150 μm or lower, after back grinding.

Plural element formation regions 20, each having the same rectangular flat plane shape that forms the basis of a repeating pattern, are arrayed in a first direction and a second direction intersecting the first direction in a central portion 14 of a main face 12A of the semiconductor wafer 12. An integrated circuit including at least one out of a logic circuit or a memory circuit (not illustrated in the drawings) is formed in each of the element formation regions 20. The integrated circuits are configured including switching elements, resistors, capacitors, and wiring. The plural element formation regions 20 are either formed as a semiconductor device 10 that is cut into chips by dicing (dicing machining) the semiconductor wafer 12, or are formed as a wafer level semiconductor device 10 in which the semiconductor wafer 12 is left intact. Note that the first direction corresponds to the X direction illustrated in FIG. 2 and FIG. 3, and is, for example, a row direction. The second direction corresponds to the Y direction orthogonal to the X direction, and is, for example, a column direction.

As illustrated in FIG. 2, n of the element formation regions 20, from an element formation region 20 (1, 1) to an element formation region 20 (1, n) serving as first element formation regions, are arrayed along the first direction in a first tier, this being an uppermost tier of the central portion 14 of the semiconductor wafer 12. Note that, n is an integer other than zero. There is no limitation to the value of n, however n is set to 6 in the present exemplary embodiment. n+m of the element formation regions 20, from an element formation region 20 (2, 1) to an element formation region 20 (2, n+m) serving as second element formation regions, are arrayed in the first direction in a second tier, configuring the next tier adjacent to the first element formation region in the second direction. m is an integer other than zero, and is set to 2 in the present exemplary embodiment. In cases in which the value of m is an even number such as 2 or 4, array pitch of the element formation region 20 (2, 1) to the element formation region 20 (2, n+m) in the first direction would be the same array pitch of the element formation region 20 (1, 1) to the element formation region 20 (1, n) in the first direction. In cases in which the value of m is an odd number such as 1 or 3, the array pitch are offset therefrom by half the array pitch.

n+m+o of the element formation regions 20, from an element formation region 20 (3, 1) to an element formation region 20 (3, n+m+o) serving as third element formation regions, are arrayed in the first direction in a third tier that is adjacent to the second element formation regions in the second direction. o is an integer other than zero, and is set to 2 in the present exemplary embodiment. n+m+o+p of the element formation regions 20, from an element formation region 20 (4, 1) to an element formation region 20 (4, n+m+o+p) serving as fourth element formation regions, are arrayed in a fourth tier that is adjacent to third element formation regions in the second direction. p is an integer other than zero, and is set to 2 in the present exemplary embodiment.

The layout relationship between the element formation regions 20 in the first tier and the element formation regions 20 in the second tier matches the layout relationship between the element formation regions 20 in the second tier and the element formation regions 20 in the third tier, since the number of element formation regions 20 simply increases by m or o along the first direction in the next tier. Moreover, the layout relationship between the element formation regions 20 in the second tier and the element formation regions 20 in the third tier matches the layout relationship between the element formation regions 20 in the third tier and the element formation regions 20 in the fourth tier, since the number element formation regions 20 simply increases by o or p along the first direction in the next tier. Accordingly, the layout relationship between the element formation regions 20 in the second tier and the element formation regions 20 in the third tier, and the layout relationship between the element formation regions 20 in the third tier and the element formation regions 20 in the fourth tier, match the layout relationships between the element formation regions 20 in the first tier and the element formation regions 20 in the second tier. Namely, the element formation regions 20 in a higher tier may be regarded as first element formation regions, and the element formation regions 20 in a lower tier thereto may be regarded as second element formation regions.

n+m+o+p of the element formation regions 20, from an element formation region 20 (5, 1) to an element formation region 20 (5, n+m+o+p), and n+m+o+p of the element formation regions 20 from an element formation region 20 (9, 1) to an element formation region 20 (9, n+m+o+p), are respectively arrayed in a fifth tier, that is adjacent in the second direction to the element formation regions 20 in the fourth tier, through to a ninth tier. The number of the element formation regions 20 arrayed along the first direction in each of the fifth tier to the ninth tier is set the same as the number of the element formation regions 20 arrayed along the first direction in the fourth tier.

n+m+o of the element formation regions 20, from an element formation region 20 (10, 1) to an element formation region 20 (10, n+m+o), are arrayed in a tenth tier that is adjacent in the second direction to the element formation regions 20 in the ninth tier. n+m of the element formation regions 20, from an element formation region 20 (11, 1) to an element formation region 20 (11, n+m), are arrayed in an eleventh tier that is adjacent in the second direction to the element formation regions 20 in the tenth tier. n of the element formation regions 20, from an element formation region 20 (12, 1) to an element formation region 20 (12, n), are arrayed in a twelfth tier, this being a final tier, that is adjacent in the second direction to the element formation regions 20 in the eleventh tier. The layout relationship between the element formation regions 20 in the ninth tier to the element formation regions 20 in the twelfth tier is equivalent to the layout relationship between the element formation regions 20 in the first tier to the element formation regions 20 in the fourth tier (on progression from the bottom toward the top of FIG. 2), except for being inverted with respect to the second direction.

In the semiconductor device 10 configured in this manner, a large number of the rectangular shaped element formation regions 20 can be arrayed on the main face 12A of the circular shaped semiconductor wafer 12. This thereby enables the main face 12A of the semiconductor wafer 12 to be effectively utilized.

Figure 7:
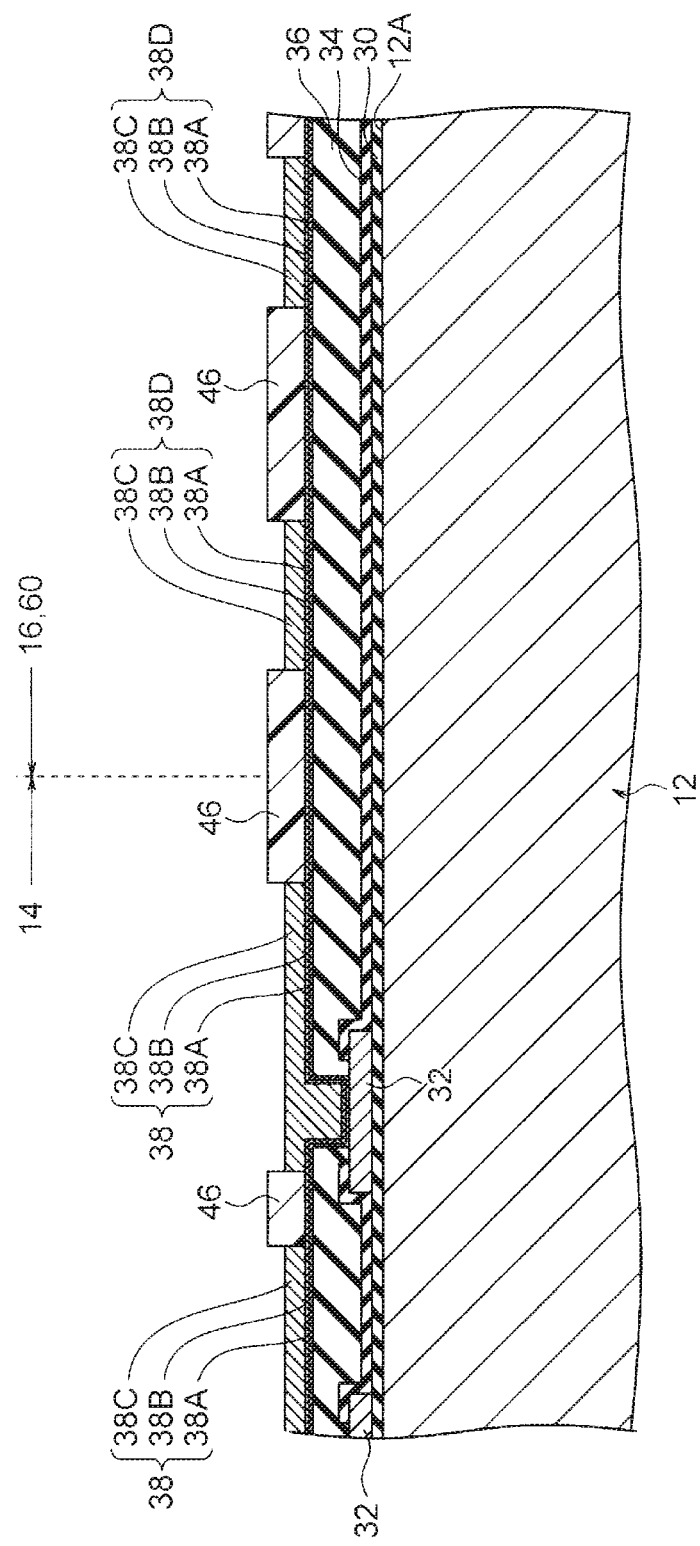
FIG. 7 is a cross-sectional view of a fourth process.

As illustrated in FIG. 1, plural electrodes 32 are arrayed on the integrated circuits in each of the element formation regions 20 on the main face 12A of the semiconductor wafer 12, with an inter-layer insulation layer 30 interposed between the integrated circuits and the electrodes 32. The electrodes 32 are what are referred to as bonding pads, and are electrically connected to the integrated circuits (not illustrated in the drawings) through wiring. The electrodes 32 are, for example, formed mainly from aluminum (Al) alloy layer. Redistribution lines 38 are disposed over the electrodes 32, with a surface protection layer 34 and an inter-layer insulation layer 36 interposed between the redistribution lines 38 and the electrodes 32. The redistribution lines 38 are electrically connected to the electrodes 32 via connection holes (see 36H in FIG. 5). In the present exemplary embodiment, as illustrated in FIG. 7, the redistribution lines 38 are formed from a composite film including a lowermost layer of an undercoat metal layer 38A, an intermediate layer of an anti-oxidation layer 38B, and an uppermost layer of a metal layer 38C, respectively layered in this sequence. A titanium (Ti) layer, for example, is employed for the undercoat metal layer 38A. A copper (Cu) layer or a Cu alloy layer, for example, is employed for the anti-oxidation layer 38B. A Cu layer or a Cu alloy layer, for example, is employed for the metal layer 38C. Note that, Cu has a lower specific resistance value than the specific resistance value of the Al.

Returning to FIG. 1, a sealing resin layer 40 is formed so as to cover the redistribution lines 38 across the entire region of the main face 12A of the semiconductor wafer 12. Column shaped external electrode pads 42, which are electrically connected to the redistribution lines 38 and that serve as a final wiring layer, are embedded in the sealing resin layer 40 above the redistribution lines 38. The external electrode pads 42 are, for example, formed from a Cu layer or Cu alloy layer.

Plural projecting electrodes (bump electrodes) 44 that are electrically connected to the external electrode pads 42 are formed on the external electrode pads 42 corresponding to each of the respective external electrode pads 42. Note that, in the semiconductor device 10 of the present exemplary embodiment, each of the element formation regions 20 is formed as a Ball Grid Array package, in which the ball shaped projecting electrodes 44 are arrayed. As illustrated in FIG. 3, the projecting electrodes 44 are regularly arrayed in the first direction and the second direction. Since the external electrode pads 42 are provided directly below the projecting electrodes 44, the external electrode pads 42 are regularly arrayed in the first direction and the second direction, similarly to the array of the projecting electrodes 44. These regular arrays of the projecting electrodes 44 and the external electrode pads 42 are laid out by wiring the redistribution lines 38 from the electrodes 32. In the present exemplary embodiment, solder bump electrodes are employed as the projecting electrodes 44. Note that Cu bump electrodes or stud shaped bump electrodes may be employed as the projecting electrodes 44.

As illustrated in FIG. 1 and FIG. 3, plural dummy projecting electrodes 44D are arrayed at a peripheral portion 16 of the main face 12A of the semiconductor wafer 12. As illustrated in FIG. 3, the dummy projecting electrodes 44D are arrayed in the peripheral portion 16 so as to overlap a triangle 60. The triangle 60 is defined by a first edge (right side) 20A of the element formation region 20 (1, n) forming a boundary with the peripheral portion 16, and a second edge (upper edge) 20B of the element formation region 20 (2, n+m) that is adjacent to a corner 20C of the first edge 20A and forming a boundary with the peripheral portion 16. To aid understanding, the triangle 60 is indicated by hatching in the drawings. In the present exemplary embodiment, the triangle 60 is set as an isosceles right triangle, since the element formation regions 20 has a square shape such that the first edge 20A and the second edge 20B are set with equal lengths, and the corner 20C has an internal angle of 90°. Note that the meaning of "overlapping" here encompasses cases in which, when seen in plan view, the dummy projecting electrodes 44D fall within the outline of the triangle 60, and also encompasses cases in which the dummy projecting electrodes 44D partially overlap with a hypotenuse 20D of the triangle 60.

As illustrated in FIG. 1, the dummy projecting electrodes 44D have the same structure, and are formed from the same material, as the projecting electrodes 44 of the element formation regions 20. An array spacing of the dummy projecting electrodes 44D is set so as to match an array spacing of the projecting electrodes 44. As will be explained in the manufacturing method of the semiconductor device 10, described later, the dummy projecting electrodes 44D are formed by the same manufacturing processes as the manufacturing processes of the projecting electrodes 44 (see FIG. 12). Dummy electrode pads 42D and dummy redistribution lines 38D are provided directly below the dummy projecting electrodes 44D. The dummy electrode pads 42D have the same structure, are formed from the same material, and are formed by the same manufacturing processes, as the external electrode pads 42 (see FIG. 10). Similarly, the dummy redistribution lines 38D have the same structure, are formed from the same material, and are formed by the same manufacturing processes, as the redistribution lines 38 (see FIG. 6 to FIG. 8).

In the present exemplary embodiment, as illustrated in FIG. 3, the dummy electrode pads 42D are also arrayed in a region within the peripheral portion 16 but outside the triangles 60. Front faces of these dummy electrode pads 42D are exposed, but are not formed with the dummy projecting electrodes 44D. Accordingly, the dummy projecting electrodes 44D may be arrayed efficiently so as to reduce component costs and reduce manufacturing costs by reducing the arrayed number of dummy projecting electrodes 44D that are unnecessary for electrical configuration.

Returning to FIG. 3, the dummy projecting electrodes 44D are also arrayed in the peripheral portion 16 so as to overlap a triangle 60. The triangle 60 is defined by a first edge (right edge) 20A of the element formation region 20 (2, n+m) forming a boundary with the peripheral portion 16, and a second edge (upper edge) 20B of the element formation region 20 (3, n+m+o) that is adjacent to a corner 20C of the first edge 20A and forms a boundary with the peripheral portion 16. Although not illustrated in the drawings, the dummy projecting electrodes 44D are also arrayed in the peripheral portion 16 so as to overlap a triangle 60 defined by a first edge (right edge) 20A of the element formation region 20 (3, n+m+o) forming a boundary with the peripheral portion 16, and a second edge (upper edge) 20B of the element formation region 20 (4, n+m+o+p) that is adjacent to a corner 20C of the first edge 20A and forming a boundary with the peripheral portion 16.

Although not described in detail, the dummy projecting electrodes 44D are also arrayed overlapping respective triangles 60 formed in the peripheral portion 16 by the element formation region 20 (1, 1) to the element formation region 20 (4, 1), and the element formation region 20 (9, 1) to the element formation region 20 (12, 1), as illustrated in FIG. 2. Similarly, the dummy projecting electrodes 44D are also arrayed in the peripheral portion 16 so as to overlap respective triangles 60 formed by the element formation region 20 (9, n+m+o+p) to the element formation region 20 (12, n).

Note that, in cases in which, for example, array pitch of the element formation regions 20 in the first tier and array pitch of the element formation regions 20 in the second tier are offset from each other by half the array pitch in the first direction (in cases in which m is an odd number), the triangles 60 are right-angled triangles in which the length of the second edge 20B would become half the length of the first edge 20A. Even in such case, Plural dummy projecting electrodes 44D are arrayed overlapping the triangles 60 in the peripheral portion 16. Moreover, the dummy projecting electrodes 44D are arrayed similarly in cases in which the element formation regions 20 are rectangular flat plane shaped.

Figure 4:
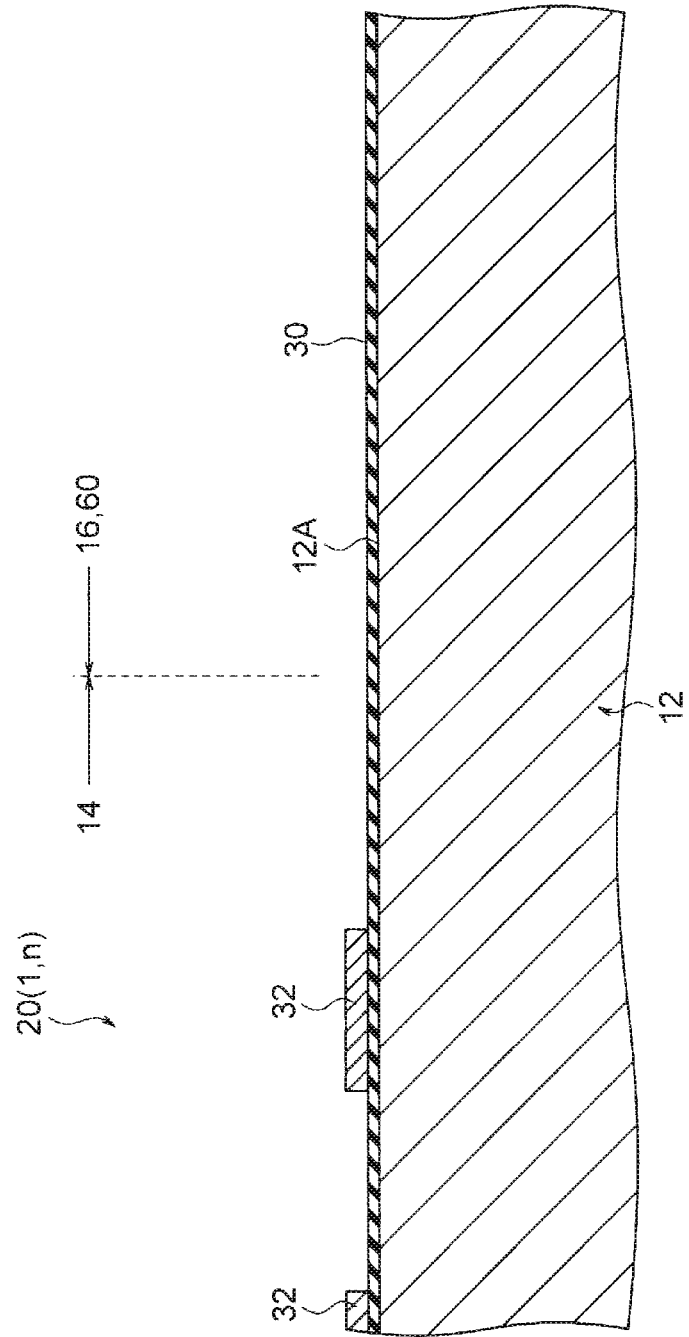
FIG. 4 is a cross-sectional view corresponding to FIG. 1 to explain a manufacturing method of a semiconductor device according to the first exemplary embodiment, and illustrates a first process.

The semiconductor device 10 according to the present exemplary embodiment is manufactured as described below. First, the semiconductor wafer 12 is prepared with a thickness of, for example, 600 μm to 650 μm (see FIG. 4). The plural rectangular flat plane shaped element formation regions 20, not illustrated in FIG. 4, are formed regularly along the first direction and the second direction in the central portion 14 of the main face 12A of the semiconductor wafer 12. Next, the inter-layer insulation layer 30 is formed over the entire main face 12A, including both the central portion 14 and the peripheral portion 16. The inter-layer insulation layer 30 is, for example, formed by a single layer film of a silicon oxide film or a silicon nitride film, or is formed by a composite film of both a silicon oxide film and a silicon nitride film.

Figure 5:
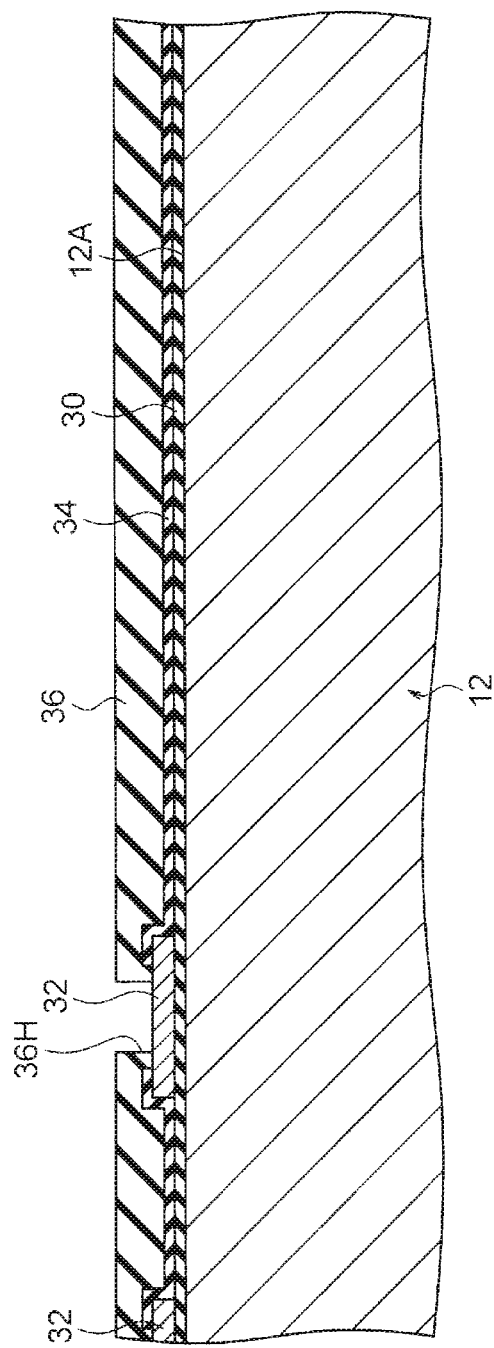
FIG. 5 is a cross-sectional view of a second process.

As illustrated in FIG. 4, the electrodes 32 and wiring, not illustrated in the drawings, are formed in the element formation regions 20 at the central portion 14. The electrodes 32 are, for example, formed using a sputtering method, and are formed principally from an Al alloy layer. The electrodes 32 are patterned using photolithography technology or etching technology. Next, the surface protection layer 34 covering the electrodes 32, and the inter-layer insulation layer 36, are formed in sequence over the entire main face 12A. The surface protection layer 34 is, for example, formed using plasma Chemical Vapor Deposition (CVD), and formed by a silicon nitride film. The inter-layer insulation layer 36 is, for example, formed using a spin coating method, and formed by a light-sensitive resin film. As illustrated in FIG. 5, the inter-layer insulation layer 36 is selectively removed above the electrodes 32 to form the connection holes 36H, in which front faces of the electrodes 32 are exposed. The connection holes 36H are formed using photolithography technology or etching technology.

Figure 6:
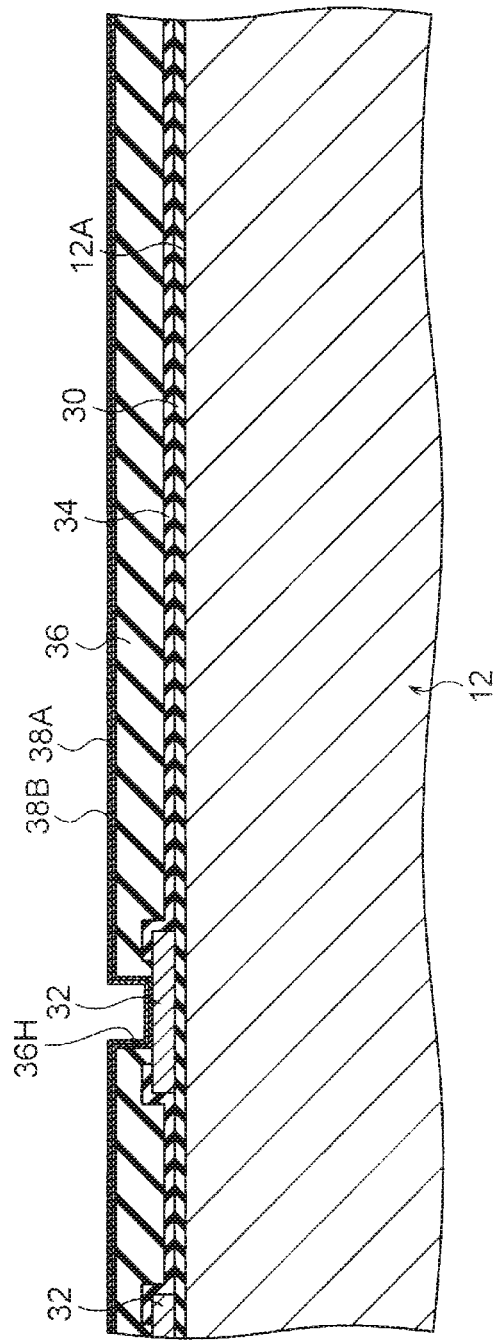
FIG. 6 is a cross-sectional view of a third process.

As illustrated in FIG. 6, the undercoat metal layer 38A and the anti-oxidation layer 38B are respectively layered in sequence over the entire inter-layer insulation layer 36. The undercoat metal layer 38A and the anti-oxidation layer 38B are, for example, formed using a sputtering method. The undercoat metal layer 38A is electrically connected to the electrodes 32 via the connection holes 36H.

Figure 8:
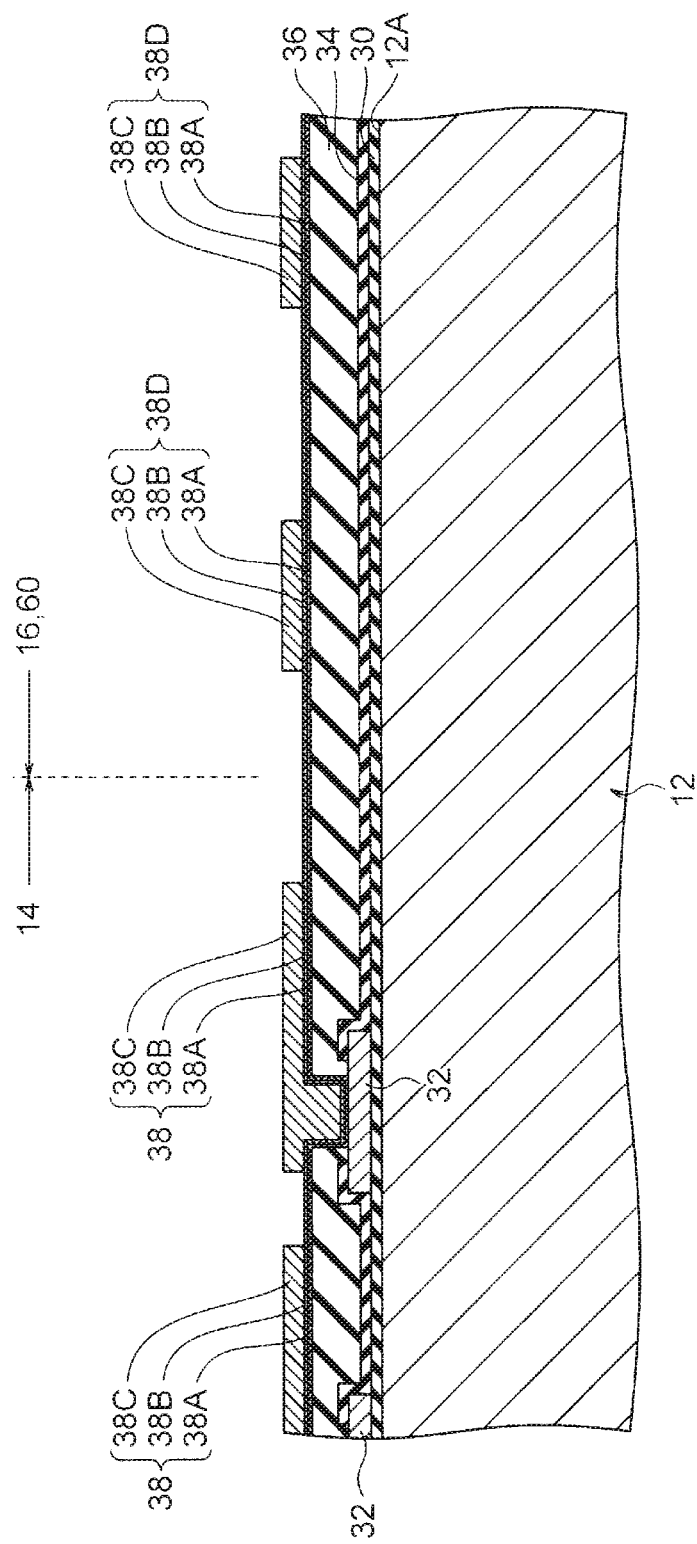
FIG. 8 is a cross-sectional view of a fifth process.

Next, a mask 46 with a pattern corresponding to the redistribution lines 38 is formed over the anti-oxidation layer 38B (see FIG. 7). For example, a resist film is employed as the mask 46. The resist film is formed using photolithography technology. Note that, the mask 46 is formed with a pattern of holes (not allocated reference numbers) over the element formation regions 20, and also in regions of the peripheral portion 16 overlapping the triangles 60 described above (the formation region of the dummy redistribution lines 38D). As illustrated in FIG. 7, an electroplating method employing the antioxidant layer 38B as an electrode is used to form the metal layer 38C over the antioxidant layer 38B exposed through the mask 46. Forming the metal layer 38C completes formation of the redistribution lines 38 in which the undercoat metal layer 38A, the anti-oxidation layer 38B, and the metal layer 38C are layered in the element formation regions 20. Moreover, the dummy redistribution lines 38D are formed using the same manufacturing processes as the manufacturing processes of the redistribution lines 38, and with the same structure as the redistribution lines 38. The mask 46 is then removed, as illustrated in FIG. 8. Note that, in this manufacturing step, between the plural redistribution lines 38, between the plural dummy redistribution lines 38D, and between the redistribution lines 38 and the dummy redistribution lines 38D are in electrically connected states through the undercoat metal layer 38A and the anti-oxidation layer 38B.

Figure 9:
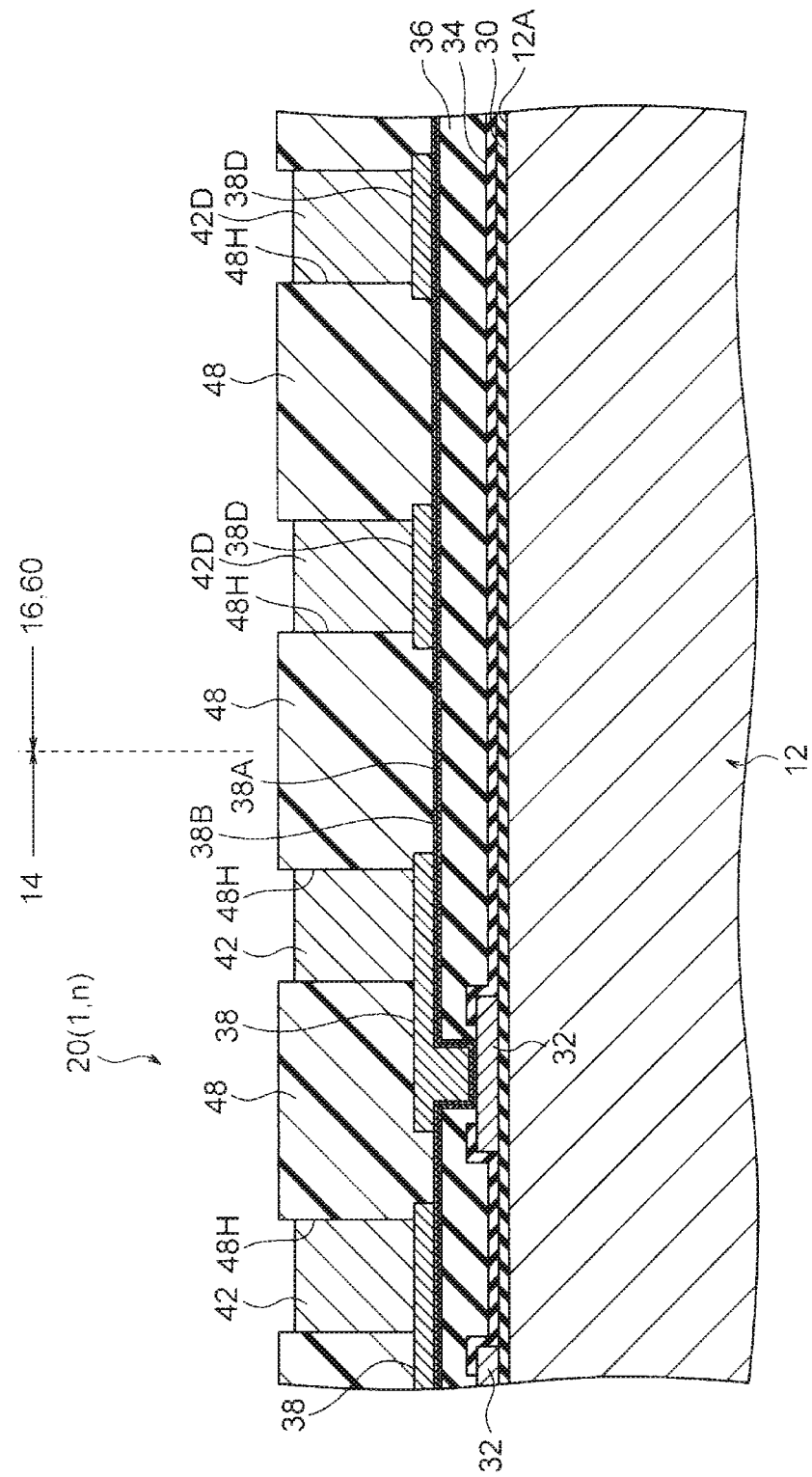
FIG. 9 is a cross-sectional view of a sixth process.
Figure 10:
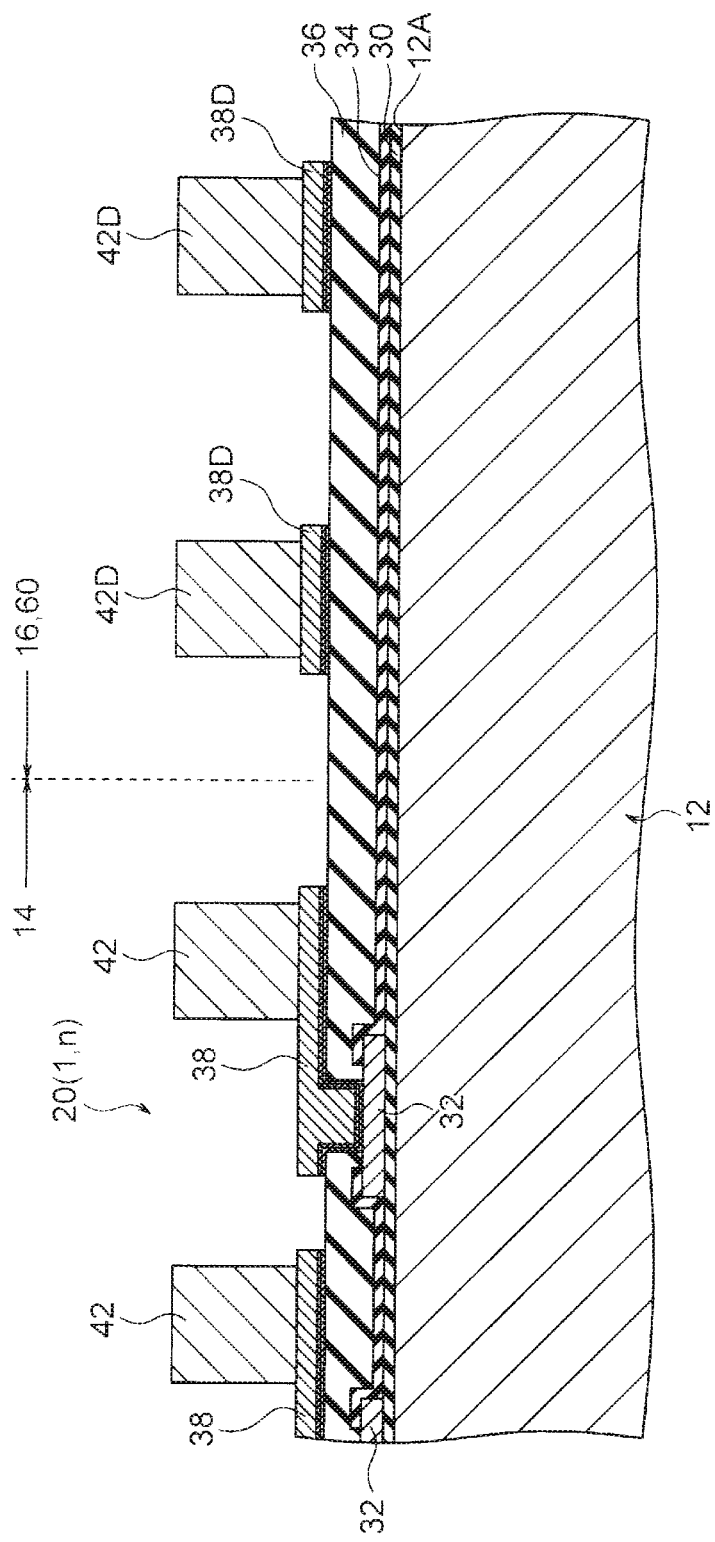
FIG. 10 is a cross-sectional view of a seventh process.

Next, a mask 48 is formed over the entire main face 12A so as to cover the redistribution lines 38 and the dummy redistribution lines 38D (see FIG. 9). In the mask 48, holes 48H are formed so as to penetrate therethrough, at positions over the redistribution lines 38 and the dummy redistribution lines 38D that configure a formation region for the projecting electrodes 44. For example, in the present exemplary embodiment, a resist film is employed as the mask 48. The resist film is formed using photolithography technology. As illustrated in FIG. 9, an electroplating method employing the redistribution lines 38 (specifically, the metal layer 38C) as electrodes is used to form the column shaped external electrode pads 42 on the redistribution lines 38 exposed through the holes 48H in the mask 48. The column shaped dummy electrode pads 42D are formed on the dummy redistribution lines 38D exposed through the holes 48H in the mask 48 during the same manufacturing process as the manufacturing process of the external electrode pads 42. The mask 48 is then removed, as illustrated in FIG. 10.

Figure 11:
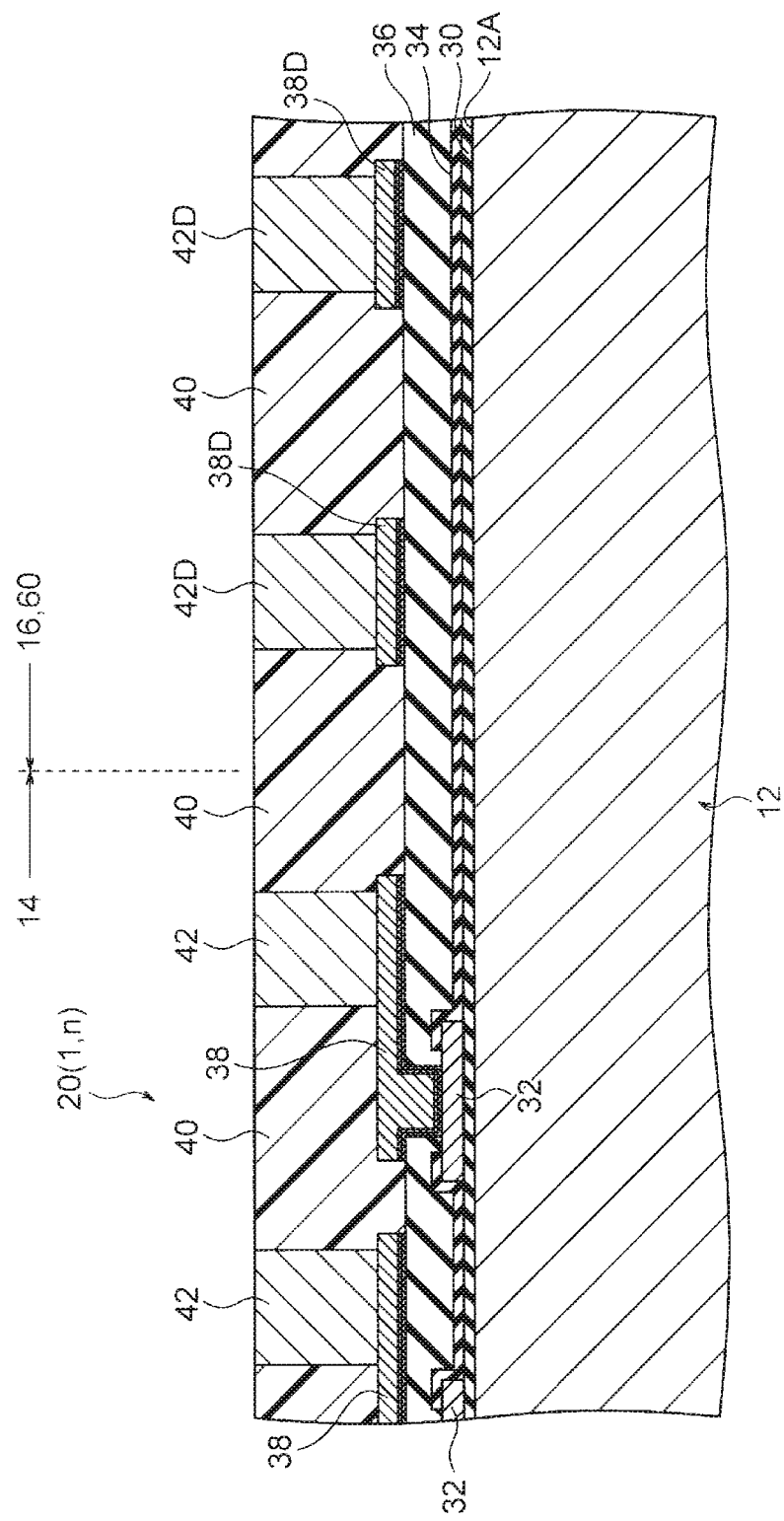
FIG. 11 is a cross-sectional view of an eighth process.

Next, the sealing resin layer 40 that has a thicker film thickness than the film thickness of the external electrode pads 42 and the dummy electrode pads 42D is formed over the entire main face 12A, so as to cover the external electrode pads 42 and the dummy electrode pads 42D (see FIG. 11). The sealing resin layer 40 protects the redistribution lines 38, the electrodes 32, and the integrated circuits below the external electrode pads 42. As illustrated in FIG. 11, a portion of the thickness of the sealing resin layer 40 is removed from a front face so as to expose front faces of the external electrode pads 42 and the dummy electrode pads 42D. For example, grinding using a grinder, or a Chemical Mechanical Polishing (CMP) method is employed to remove the sealing resin layer 40. The external electrode pads 42 and the dummy electrode pads 42D embedded in the sealing resin layer 40 are accordingly formed during the same manufacturing processes as each other.

Figure 12:
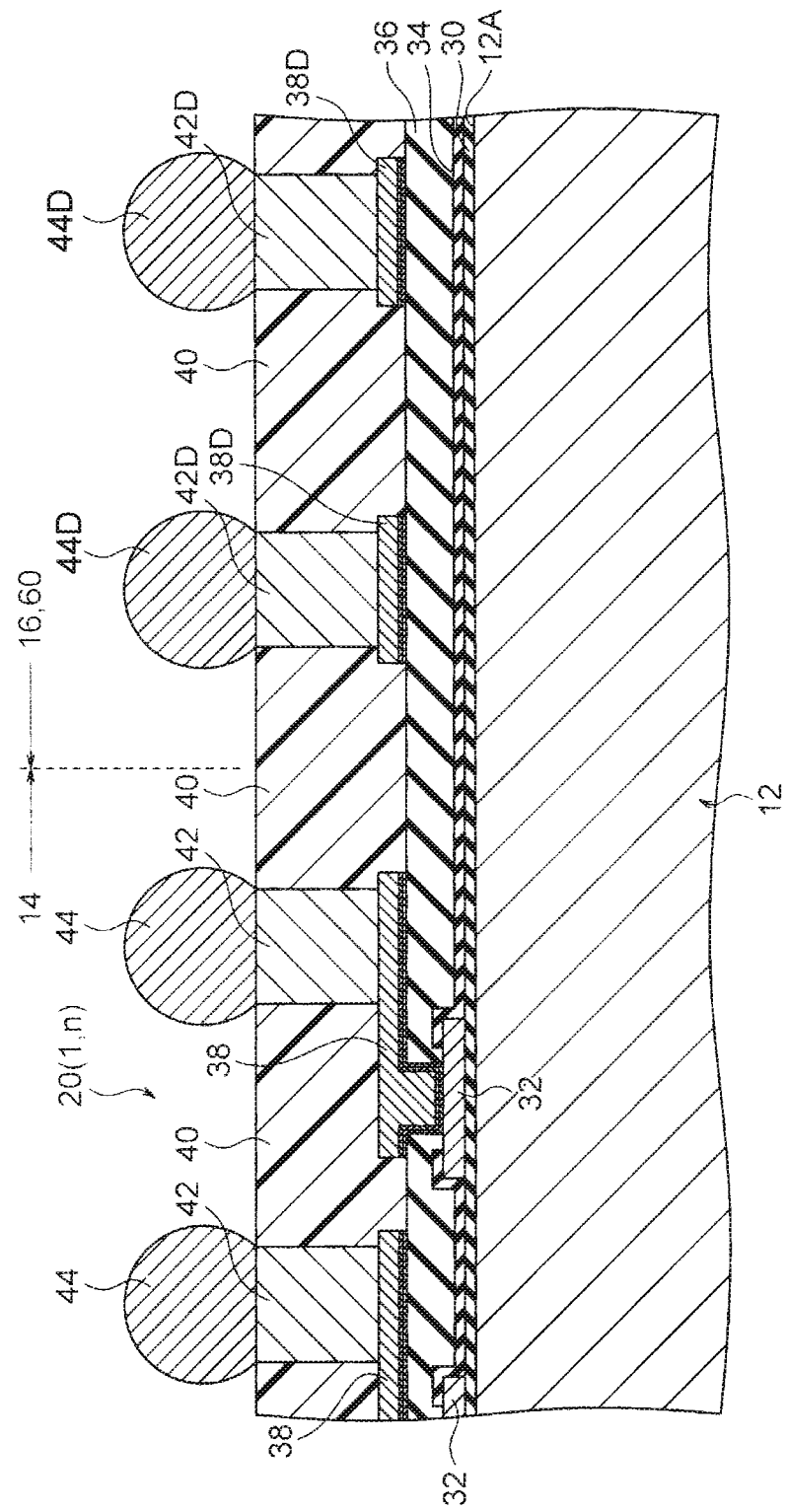
FIG. 12 is a cross-sectional view of a ninth process.

As illustrated in FIG. 12, in the element formation regions 20 the projecting electrodes 44 are formed on the external electrode pads 42 so as to be electrically connected to the external electrode pads 42. During the same manufacturing process as the manufacturing process of the projecting electrodes 44, the dummy projecting electrodes 44D are formed on the dummy electrode pads 42D so as to be electrically connected to the dummy electrode pads 42D overlapping the triangles 60 of the peripheral portion 16 illustrated in FIG. 3. Although front faces of the dummy electrode pads 42D are also exposed in regions that do not overlap the triangles 60 of the peripheral portion 16, in the manufacturing method of the semiconductor device 10 according to the present exemplary embodiment, the dummy projecting electrodes 44D are not formed on these dummy electrode pads 42D.

Figure 13:
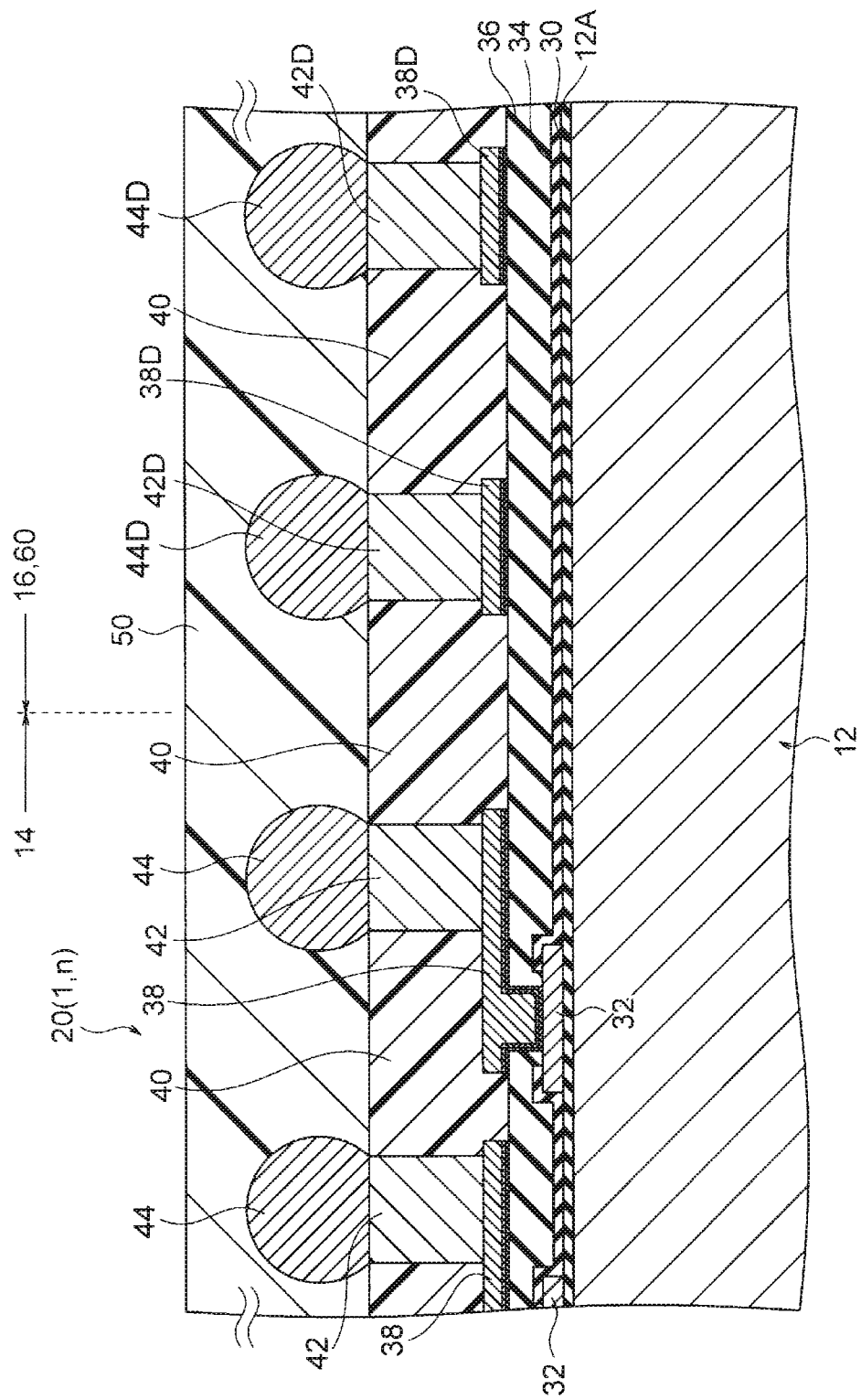
FIG. 13 is a cross-sectional view of an eleventh process.

As illustrated in FIG. 13, a protective tape 50 used during back grinding is adhered so as to cover the projecting electrodes 44 and the dummy projecting electrodes 44D over the entire main face 12A of the semiconductor wafer 12. The protective tape 50 protects the projecting electrodes 44, as well as the external electrode pads 42, the redistribution lines 38, the electrodes 32, the integrated circuits, and the like in layers below the projecting electrodes 44 when back grinding a back face 12B (see FIG. 1) of the semiconductor wafer 12 to thin the thickness of the semiconductor wafer 12. Although its cross-sectional view structure is not described in detail, in the present exemplary embodiment, the protective tape 50 has a dual-layer structure including a tape shaped resin film serving as a substrate, and an ultraviolet (UV) cured adhesive layer formed on a surface on the projecting electrode 44 side of the resin film. Note that a polyolefin resin film with a thickness of, for example, 180 μm to 220 μm and having a function of allowing UV to pass through may be employed as the resin film of the protective tape 50. Moreover, an acrylic resin layer having a thickness of, for example, 110 μm to 150 μm may be employed as the adhesive layer.

Figure 15:
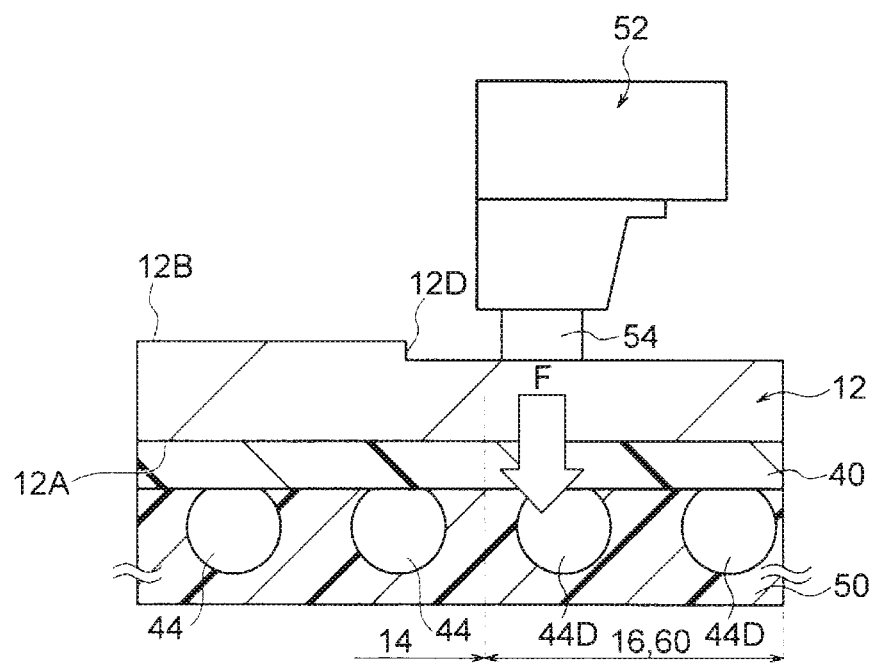
FIG. 15 is an enlarged cross-sectional view of a process illustrating relevant portions of a semiconductor device according to the first exemplary embodiment during back grinding.

Next, as illustrated in FIG. 15, the semiconductor wafer 12 is inverted, and a back grinding wheel 52 is employed to perform back grinding of the back face 12B of the semiconductor wafer 12 in an adhered state of the protective tape 50. In the present exemplary embodiment, the back face 12B is thereby ground such that the thickness of the semiconductor wafer 12 is thinned to 200 μm or less, and preferably to approximately 150 μm.

Figure 16:
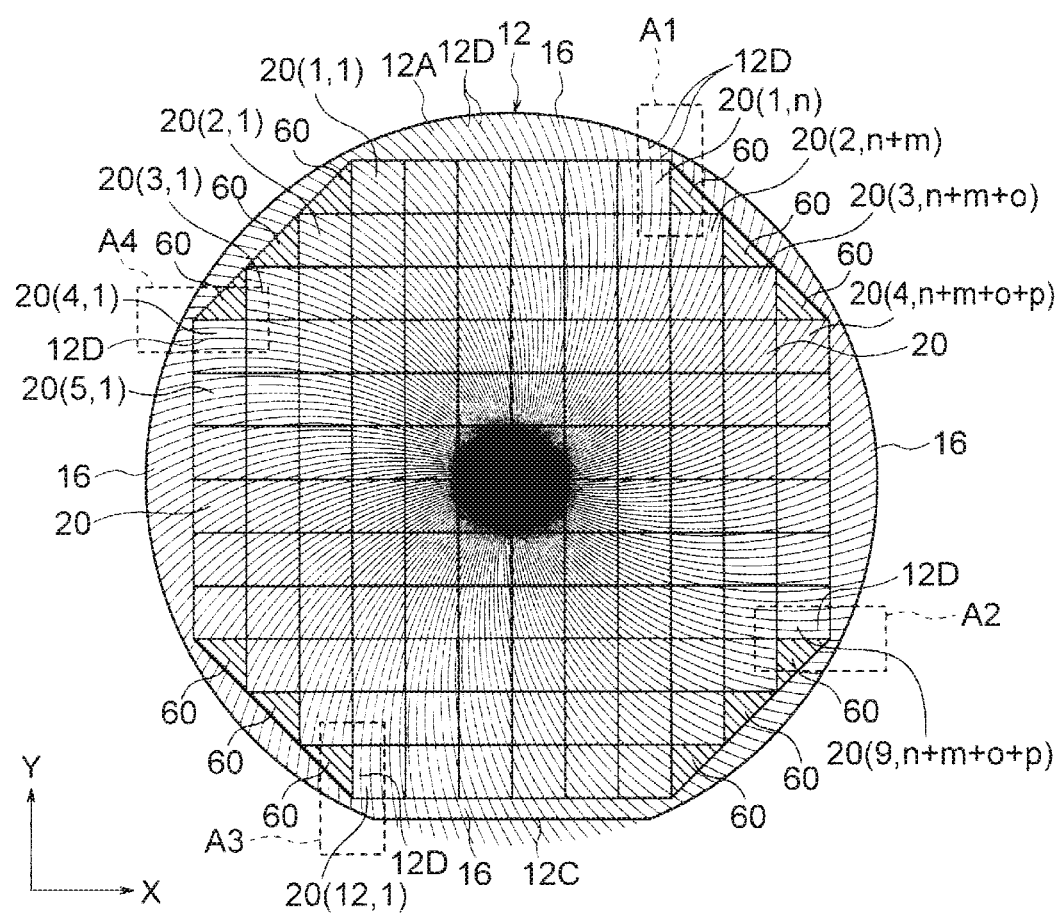
FIG. 16 is a schematic plan view of a semiconductor device corresponding to FIG. 2, to explain a relationship between grinding marks formed by back grinding and placement positions of dummy projecting electrodes in a manufacturing method of a semiconductor device according to the first exemplary embodiment.

During back grinding, a grindstone 54 of the back grinding wheel 52 contacts the back face 12B of the semiconductor wafer 12, and the grindstone 54 rotates relative to the semiconductor wafer 12. The back face 12B is accordingly ground, and the thickness of the semiconductor wafer 12 is made thinner. When this is performed, as illustrated in FIG. 2, FIG. 3, FIG. 15, and FIG. 16, numerous grinding marks (saw marks) 12D are formed on the back face 12B of the semiconductor wafer 12 from the center toward the circumference of the semiconductor wafer 12, forming circular arc shapes. Note that, although FIG. 2, FIG. 3, and FIG. 16 illustrate the semiconductor wafer 12 as viewed from the main face 12A side, the grinding marks 12D formed in the back face 12B are shown as if projected onto the main face 12A. To aid understanding, FIG. 2 and FIG. 3 only show one of the grinding marks (saw marks) 12D that are illustrated in FIG. 16.

Figure 17:
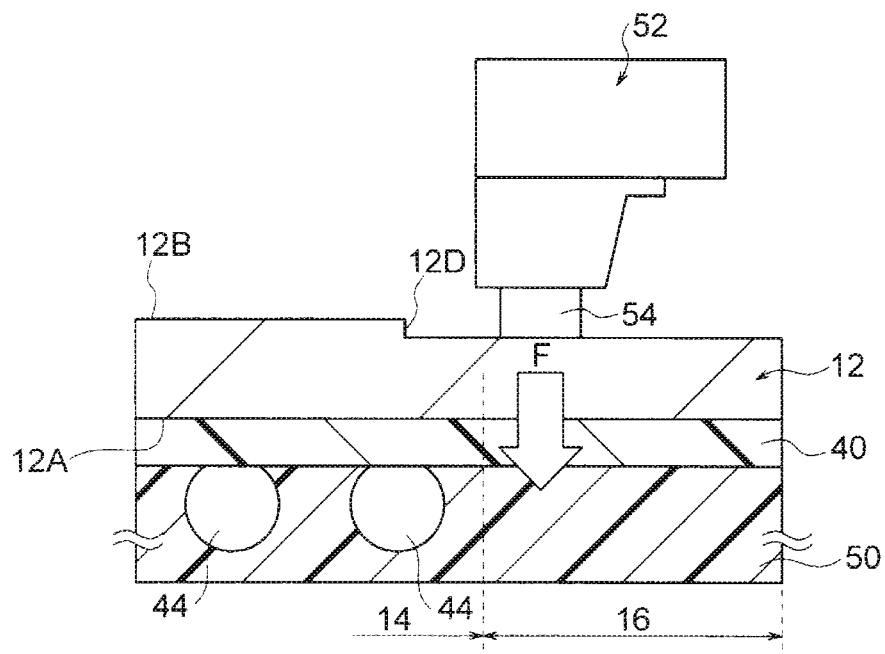
FIG. 17 is an enlarged cross-sectional view of a process illustrating relevant portions of a semiconductor device according to a comparative example during back grinding.

In a semiconductor device according to a comparative example, as illustrated in FIG. 17, the projecting electrodes 44 are arrayed across the central portion 14. However, the projecting electrodes 44 are not disposed in the peripheral portion 16, and end at the boundary between the central portion 14 and the peripheral portion 16 on the main face 12A of the semiconductor wafer 12 (for example, corresponding to the first edge 20A illustrated in FIG. 3). The boundary is a dividing line between the peripheral portion 16 and the element formation regions 20 disposed furthest to the peripheral portion 16 side of the central portion 14, and also corresponds to outermost dicing lines. In regions A1 to A4 illustrated in FIG. 3 and FIG. 16, where the positions of the plural projecting electrodes 44 arrayed furthest to the peripheral portion 16 side, along the boundary, and the grinding marks 12D extending along the boundary, are aligned in the thickness direction of the semiconductor wafer 12, are vulnerable to damages such as cracking and chipping of the semiconductor wafer 12. As illustrated in FIG. 17, during back grinding, an extension and contraction amount of the protective tape 50 in the thickness direction of the protective tape 50 as a result of a load F received from the grindstone 54, differs according to whether or not the projecting electrodes 44 are present. Namely, the thickness direction extension and contraction amount of the protective tape 50 is larger in the peripheral portion 16, where the projecting electrodes 44 are not disposed, than in the central portion 14, where the projecting electrodes 44 are disposed. Accordingly, a deflection amount of the peripheral portion 16 of the semiconductor wafer 12 due to the load F is larger than a deflection amount in the central portion 14. Stress therefore concentrates at the boundary portions due to the different deflection amounts.

Accordingly, in the semiconductor device 10 and the semiconductor device manufacturing method according to the present exemplary embodiment, as illustrated in FIG. 2, FIG. 3, FIG. 13, FIG. 15, and FIG. 16, the dummy projecting electrodes 44D are formed in the peripheral portion 16 adjacent to the first edge 20A where a boundary is formed with the element formation region 20. In particular, in the present exemplary embodiment, the dummy projecting electrodes 44D are formed, for example, overlapping the triangle 60 formed by the first edge 20A of the element formation region 20 (1, n) and the second edge 20B of the element formation region 20 (2, n+m) that is adjacent in the second direction and offset by the specific array pitch in the first direction.

As illustrated in FIG. 15, in a region that superimpose with the grinding marks 12D, the dummy projecting electrodes 44D are formed and arrayed in the peripheral portion 16 so as to continue on from the projecting electrodes 44 in the element formation regions 20. Namely, in the present exemplary embodiment, the thickness direction extension and contraction amount of the protective tape 50 due to the load F received from the grindstone 54 is made to be uniform in the element formation regions 20 and in the peripheral portion 16. Accordingly, a deflection amount (i.e. there is rigidity) in the peripheral portion 16 of the semiconductor wafer 12 becomes small. Thus, the present exemplary embodiment may suppress stress from arising at the boundary portions, and may prevent damages such as cracking and chipping to occur in the peripheral portion 16 of the main face 12A of the semiconductor wafer 12.

Figure 18:
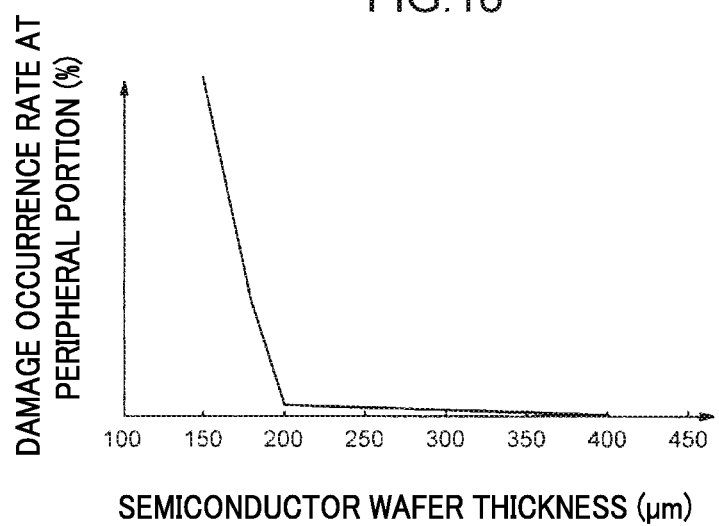
FIG. 18 is a graph illustrating a relationship between substrate thickness and a damage occurrence rate during back grinding in a manufacturing method of a semiconductor device according to the first exemplary embodiment.

FIG. 18 illustrates a relationship between the thickness of the semiconductor wafer 12 after back grinding, and the rate of occurrence of damage, such as cracking and chipping, in the peripheral portion 16 of the semiconductor wafer 12. The horizontal axis shows the thickness ($\mu$m) of the semiconductor wafer 12 after back grinding. The vertical axis shows the damage occurrence rate (%) in the peripheral portion 16 of the semiconductor wafer 12. As illustrated in FIG. 18, a sharp increase in the damage occurrence rate would be expected in a case in which the thickness of the semiconductor wafer 12 after back grinding falls below 200 $\mu$m. At a thickness of 200 $\mu$m, the damage occurrence rate is 0.6% to 0.7%. At a thickness of 150 $\mu$m, the damage occurrence rate reaches close to 20%. Accordingly, the substrate manufacturing method according to the present exemplary embodiment may be effective in a case in which the present exemplary embodiment is applied to a semiconductor wafer 12 with a thickness of 200 $\mu$m or lower, and is particularly effective in a case in which the present exemplary embodiment is applied to a semiconductor wafer 12 with a thickness of 150 $\mu$m or lower.

Figure 14:
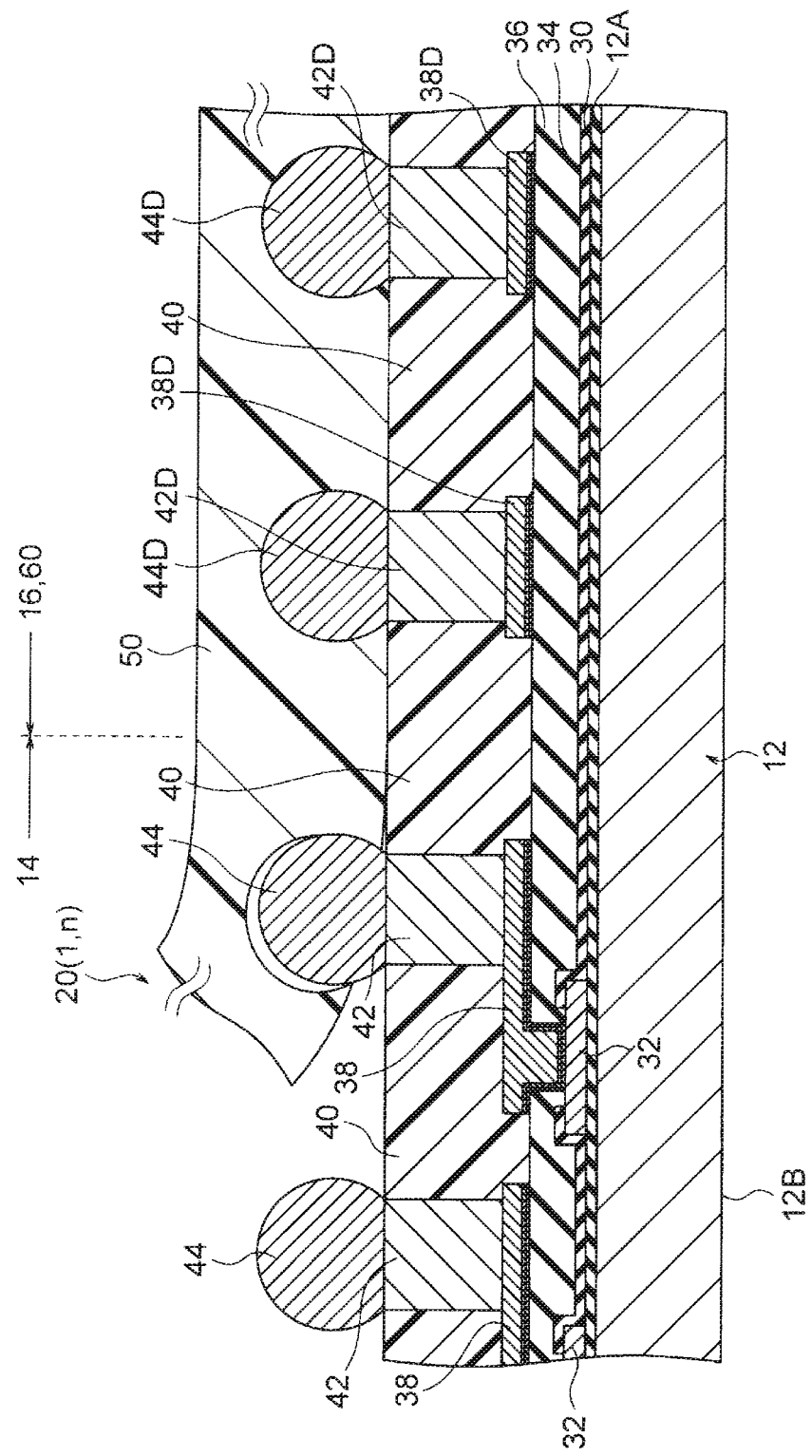
FIG. 14 is a cross-sectional view of a twelfth process.

Returning to the manufacturing method, the semiconductor wafer 12 is inverted a second time, and the protective tape 50 is irradiated with UV to lower the adhesive force of the adhesive layer of the protective tape 50. Then, as illustrated in FIG. 14, the protective tape 50 is peeled away from the main face 12A of the semiconductor wafer 12. When this series of manufacturing processes is completed, the semiconductor device 10 configured using the thinned semiconductor wafer 12 illustrated in FIG. 1 is complete.

The semiconductor device 10 is then employed as a semiconductor device with a wafer level chip size package structure. Although omitted from the explanation and illustrations, the semiconductor device 10 is then diced to produce completed chip shaped semiconductor devices diced from each of the element formation regions 20.

As illustrated in FIG. 1 to FIG. 3, the semiconductor device 10 according to the present exemplary embodiment includes the plural dummy projecting electrodes 44D formed in the peripheral portion 16 of the main face 12A of the semiconductor wafer 12. More specifically, the dummy projecting electrodes 44D are arrayed overlapping the triangles 60, shown for convenience in FIG. 2 and FIG. 3. One of the triangles 60 is defined by the first edge 20A of the element formation region 20 (1, n) forming a boundary with the peripheral portion 16, and the second edge 20B of the element formation region 20 (2, n+m) that is adjacent to the corner 20C of the first edge 20A and forming a boundary with the peripheral portion 16. Similarly, the dummy projecting electrodes 44D are also arrayed in the triangles 60 defined by the element formation region 20 (2, n+m) through to the element formation region 20 (4, n+m+o+p) and the triangles 60 defined by the element formation region 20 (9, n+m+o+p) through to the element formation region 20 (12, n). The dummy projecting electrodes 44D are also arrayed in the triangles 60 defined by the element formation region 20 (1, 1) through to the element formation region 20 (4, 1), and the triangles 60 defined by the element formation region 20 (9, 1) through to the element formation region 20 (12, 1).

As illustrated in FIG. 15 and FIG. 16, the dummy projecting electrodes 44D are arrayed in the peripheral portion 16 at least where the peripheral portion 16 runs along the extension direction of the grinding marks 12D formed on the back face 12B of the semiconductor wafer 12 during back grinding. Due to arraying the dummy projecting electrodes 44D in the peripheral portion 16 to the projecting electrodes 44 in the element formation regions 20, the extension and contraction ratio of the protective tape 50 due to the load F received from the back grinding wheel 52 becomes uniform in both the element formation regions 20 and the peripheral portion 16. Accordingly, the present exemplary embodiment may reduce the deflection amount of the peripheral portion 16 of the semiconductor wafer 12, and the stress arising in the boundary portions between the central portion 14 and the peripheral portion 16 of the semiconductor wafer 12 may be reduced. Further, since there is no need to apply separate support members to reinforce the peripheral portion 16 of the semiconductor wafer 12, the present exemplary embodiment may eliminate occurrence of contact with the projecting electrodes 44 due to applying such support members. Accordingly, the semiconductor device 10 provided according to the present exemplary embodiment may prevent damages such as cracking and chipping of the peripheral portion 16 during back grinding, and may prevent damages to the projecting electrodes 44.

Note that the manufacturing method of the semiconductor device 10 according to the present exemplary embodiment encompasses the structures of intermediate products at the following stages: the stage illustrated in FIG. 12, at which the dummy projecting electrodes 44D have been formed in the peripheral portion 16 of the semiconductor wafer 12; the stage illustrated in FIG. 13, at which the protective tape 50 has been adhered; the stage illustrated in FIG. 15 at which back grinding is performed; and the stage illustrated in FIG. 14 in which the protective tape 50 is peeled away. The stage illustrated in FIG. 1 after the protective tape 50 has been peeled away is also included. In the intermediate product of the semiconductor device 10 after back grinding, the back face 12B of the semiconductor wafer 12 is formed with the grinding marks 12D illustrated in FIG. 15 and FIG. 16.

In the semiconductor device 10 according to the present exemplary embodiment, as illustrated in FIG. 1, the dummy electrode pads 42D connected to the dummy projecting electrodes 44D are arrayed below the dummy projecting electrodes 44D in the peripheral portion 16. The dummy electrode pads 42D are formed with the same structure as the external electrode pads 42 below the projecting electrodes 44. Note that, the adhesion force between the dummy electrode pads 42D and the dummy projecting electrodes 44D is, for example, stronger than the adhesion force between the sealing resin layer 40 and the dummy projecting electrodes 44D. This thereby enables the dummy projecting electrodes 44D to be firmly fixed. Accordingly, the dummy projecting electrodes 44D may be prevented from breaking off, for example during the process to peel away the protective tape 50 illustrated in FIG. 14.

In the semiconductor device 10 according to the present exemplary embodiment, as illustrated in FIG. 3, the dummy projecting electrodes 44D are arrayed overlapping the triangles 60 in the peripheral portion 16 of the main face 12A of the semiconductor wafer 12. Accordingly, the present exemplary embodiment may suppress the consumption of the projecting electrode material, and may prevent damage to the peripheral portion 16 of the semiconductor wafer 12. Accordingly, in the present exemplary embodiment, the dummy projecting electrodes 44D may be efficiently arrayed, and product costs may be reduced. Thus, the manufacturing method of the semiconductor device 10 of the present exemplary embodiment may reduce the manufacturing costs.

In the semiconductor device 10 according to the present exemplary embodiment, as illustrated in FIG. 3, the dummy projecting electrodes 44D are arrayed overlapping the triangles 60 in the peripheral portion 16 of the main face 12A of the semiconductor wafer 12. Accordingly, in the present exemplary embodiment, there is no need to consider the regions A1 to A4 for each low of the element formation regions 20, the regions A1 to A4 where the plural projecting electrodes 44 arrayed along the boundaries furthest toward the peripheral portion 16 side and the grinding marks 12D extending along the boundaries, are aligned in the thickness direction of the semiconductor wafer 12. Accordingly, damage to the peripheral portion 16 of the semiconductor wafer 12 may be prevented, even when the grinding marks 12D are aligned with the projecting electrodes 44. Thus, the present exemplary embodiment may reduce the number of man hours spent on design when considering the placement of the dummy projecting electrodes 44D.

In the semiconductor device 10 according to the present exemplary embodiment, as illustrated in FIG. 3, the dummy electrode pads 42D are arrayed in a region of the peripheral portion 16 of the main face 12A of the semiconductor wafer 12 that does not overlap the triangles 60 in the peripheral portion 16. This thereby enables the dummy projecting electrodes 44D to be easily arrayed overlapping the triangles 60 without modifying the array specifications of the dummy electrode pads 42D. For example, the manufacturing method of the semiconductor device 10 according to the present exemplary embodiment eliminates the need to modify the pattern of the mask 48 used to form the dummy electrode pads 42D illustrated in FIG. 9.

Moreover, in the semiconductor device 10 according to the present exemplary embodiment, as illustrated in FIG. 1, the projecting electrodes 44 arrayed in the element formation regions 20 are electrically connected to the integrated circuits, specifically elements thereof, of the element formation regions 20. However, the dummy projecting electrodes 44D arrayed in the peripheral portion 16 are not electrically connected to any elements. The dummy projecting electrodes 44D do not require electrical functionality. Accordingly, the dummy projecting electrodes 44D may be arrayed comparatively freely.

In the manufacturing method of the semiconductor device 10 according to the present exemplary embodiment, as illustrated in FIG. 12, the process of forming the dummy projecting electrodes 44D in the peripheral portion 16 is the same manufacturing process as the process for forming the projecting electrodes 44 on the element formation regions 20. This thereby may reduce the number of manufacturing processes of the semiconductor device 10 in comparison to cases in which the dummy projecting electrodes 44D and the projecting electrodes 44 are formed separately. The manufacturing method of the semiconductor device 10 may reduce the number of manufacturing processes and may achieve a thinner semiconductor wafer 12, while preventing damage such as cracking and chipping of the peripheral portion 16 of the semiconductor wafer 12 caused when grinding the back face 12B of the semiconductor wafer 12.

In the manufacturing method of the semiconductor device 10 of the present exemplary embodiment, as illustrated in FIG. 8 and FIG. 9, the respective processes for forming the dummy redistribution lines 38D and the dummy electrode pads 42D are the same manufacturing processes as the respective processes for forming the redistribution lines 38 and the external electrode pads 42. Accordingly, the present exemplary embodiment may enable a further reduction in the manufacturing processes of the semiconductor device 10.

Second Exemplary Embodiment

Figure 19:
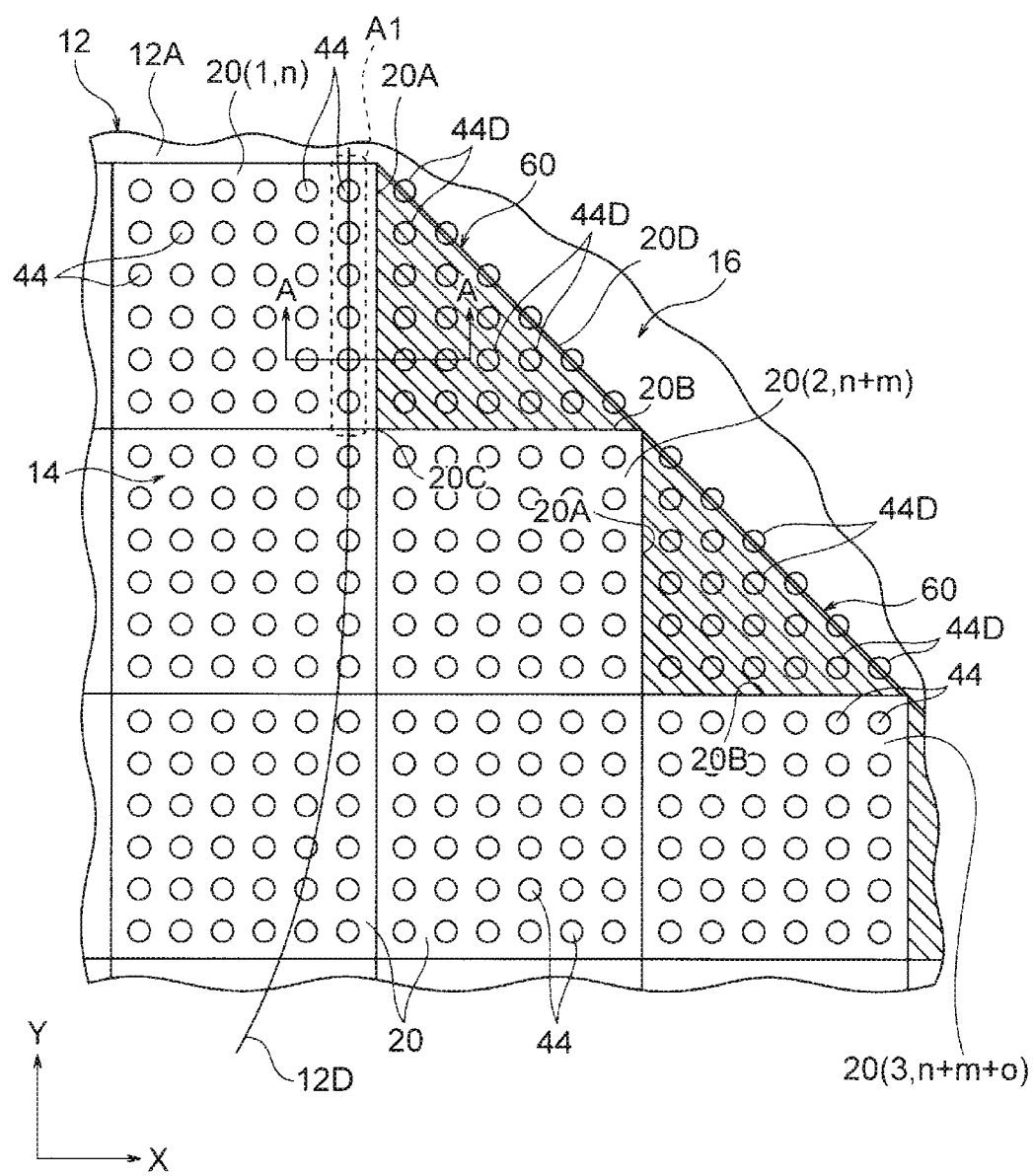
FIG. 19 is an enlarged plan view corresponding to FIG. 3, illustrating relevant portions of a semiconductor device according to a second exemplary embodiment of the present disclosure.

Explanation follows regarding a semiconductor device 10 and a semiconductor device manufacturing method according to a second exemplary embodiment of the present disclosure, with reference to FIG. 19.

As illustrated in FIG. 19, in the semiconductor device 10 according to the present exemplary embodiment, the dummy electrode pads 42D are not arrayed in the peripheral portion 16 of the main face 12A of the semiconductor wafer 12 in the regions that do not overlap the triangles 60. A front face of the sealing resin layer 40 (see FIG. 1) is exposed in these regions. Note that, in the present exemplary embodiment, the dummy redistribution lines 38D (see FIG. 1) may or may not be arrayed below the dummy electrode pads 42D. Configurations other than that of the dummy electrode pads 42D are similar to those of the semiconductor device 10 and the semiconductor device manufacturing method according to the first exemplary embodiment.

Accordingly, the semiconductor device 10 and the semiconductor device manufacturing method according to the present exemplary embodiment may obtain similar operation and effects obtained by the semiconductor device 10 and the semiconductor device manufacturing method according to the first exemplary embodiment described above.

Moreover, the semiconductor device 10 and the semiconductor device manufacturing method according to the present exemplary embodiment may reduce in the electrode material used for the dummy electrode pads 42D. This thereby may enable a further reduction in product costs and manufacturing costs.

Other Exemplary Embodiments

The present disclosure is not limited by the exemplary embodiments described above. For example, the exemplary embodiments described above employ a semiconductor wafer as a substrate. However, the present disclosure may employ a compound semiconductor substrate, a resin substrate, a glass substrate, or the like as a substrate.

What is claimed is:

1. A semiconductor device comprising:
a substrate including, in a central portion of a main face of the substrate, a plurality of first element formation regions each having a rectangular flat plane shape; and
a plurality of electrode pads formed above the first element formation regions,
wherein for each first element formation region from among the plurality of first element formation regions
a first row of dummy electrode pads are arrayed, above a peripheral portion of the main face, along a first edge of the first element formation region that forms a boundary between the first element formation region and the peripheral portion,
wherein the first row of dummy electrode pads opposes a row of the plurality of electrode pads that are arrayed above the first element formation region with the first edge therebetween,
wherein the first element formation region includes a second edge that touches a corner of the first edge, and that forms a boundary between the first element formation region and the peripheral portion,
wherein the semiconductor device further comprises a second row of dummy electrode pads arrayed above the peripheral portion of the main face along the second edge, the second row of dummy electrode pads opposing a row of the plurality of electrode pads that are arrayed above the first element formation region with the second edge therebetween, and
wherein ball shaped projecting electrodes are formed at the plurality of electrode pads and at the dummy electrode pads that are exposed in a triangular region surrounded by respective first and second edges of the plurality of first element formation regions, and the ball shaped projecting electrodes are not formed at the dummy electrode pads that are exposed in regions that do not overlap the triangular region of the peripheral portion.

2. The semiconductor device of claim 1, wherein grinding marks are formed at a region that corresponds to a row of the plurality of electrode pads above the first element formation region, at a back face of the substrate that is opposite to the main face.

* * * * *